United States Patent
Okuno

(10) Patent No.: US 6,181,150 B1
(45) Date of Patent: *Jan. 30, 2001

(54) CONTACT PROBE

(75) Inventor: Toshio Okuno, Yokohama (JP)

(73) Assignee: Soshotech Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/092,308

(22) Filed: Jun. 5, 1998

(30) Foreign Application Priority Data

Sep. 10, 1997 (JP) .................................................. 9-245400

(51) Int. Cl.⁷ .................................................. G01R 1/073
(52) U.S. Cl. .......................................... 324/762; 324/754
(58) Field of Search .......................... 324/762, 754, 324/757, 765, 72.5

(56) References Cited

U.S. PATENT DOCUMENTS

| | | | |
|---|---|---|---|
| 4,961,052 | * 10/1990 | Tada et al. | 324/754 |
| 5,055,780 | * 10/1991 | Takagi et al. | 324/765 |
| 5,221,895 | * 6/1993 | Janko et al. | 324/762 |
| 5,491,891 | * 2/1996 | Isaac | 324/762 |
| 5,548,223 | * 8/1996 | Cole et al. | 324/754 |
| 5,563,521 | * 10/1996 | Crumly | 324/757 |

FOREIGN PATENT DOCUMENTS

| | | | |
|---|---|---|---|
| 0 163 211 | * 12/1985 | (EP) . | |
| 0 624 801 | * 11 1994 | (EP) . | |
| 6-347384 | * 12/1994 | (JP) . | |
| 7-12848 | * 1/1995 | (JP) . | |
| 7-58165 | * 3/1995 | (JP) . | |

* cited by examiner

Primary Examiner—Ernest Karlsen
(74) Attorney, Agent, or Firm—Wenderoth, Lind & Ponack, L.L.P.

(57) ABSTRACT

A contact probe includes a plurality of leads arranged in array on a surface of an insulating film in an intimately contacted manner. A distal end portion of each of the leads is contacted, under pressure, with an electronic part. Each of the leads is provided with an anchor portion projecting from a mating surface thereof with respect to the insulating film and anchored in the insulating film, and the anchor portion is engaged with the insulating film.

9 Claims, 6 Drawing Sheets

CONTACT PROBE

BACKGROUND OF THE INVENTION

This invention relates to a contact probe to be contacted, under pressure, with a given electrical part such as a liquid crystal display unit, or the like.

In testing a liquid crystal display unit or the like, one end of a contact probe is brought into contact, under pressure, with an electrode pad of the liquid crystal display unit and the other end is connected to testing equipment. Owing to this arrangement, signals can be input and output.

As shown in FIG. 1, a typical contact probe 1 has a plurality of leads 3 arranged in array on a surface of an insulating film in an intimately contacted manner. A distal end portion of each lead 3 projects from one side edge of the insulating film 2 to thereby define a contact end 7 with respect to an electronic part.

The leads 3 are formed, for example, by a plating process for growing the thickness thereof to a predetermined level. The insulating film 2 restricts contact ends 7 of the leads 3 to orderly arrange (securement of pitches) the leads 3 and at the same time enables the attainment of a degree of freedom of flexure of each contact end 7 necessary for pressure contact by flexibility of the insulating film 2.

In the contact probe 1, the insulating film 2 is adhered to a rigid block 4, and the contact end 7 of the contact probe 1 projects from an end edge of the rigid block 4, so that the contact end 7 is contacted, under pressure, with an electrode pad 6 of a liquid crystal display unit 5 due to flexibility of the insulating film 2.

However, the conventional contact probe of this type has the shortcoming in that since a plurality of leads, which are as small as about 20 μm in thickness, are arranged in small pitches on a polyimide (insulating) film 2, which is as thin as about 75 μm in thickness, the leads 2 are peeled off the insulating film 2 by a flexing load applied to its pressure contact end 7 when it is contacted, under pressure, with the electrode pad 6, thus jeopardizing its pressure contact with the electrode pad 6.

Moreover, since the leads 3 arranged at such small pitches are small and thin as mentioned above, sufficient elasticity of the leads 3 is difficult to obtain at the time of flexure and a sufficient pressure contact with the electrode pad 6 is difficult to expect. Therefore, improvement is demanded.

The present invention has been accomplished under the abovementioned situation.

SUMMARY OF THE INVENTION

It is, therefore, a general object of the present invention to provide a contact probe which is capable of obviating the abovementioned shortcomings inherent in the prior art devices.

In order to achieve the above object, there is essentially provided a contact probe including a plurality of leads arranged in array on a surface of an insulating film in an intimately contacted manner, a distal end portion of each of the leads 3 being contacted, under pressure, with an electronic part, wherein each of the leads is provided with an anchor portion projecting from a mating surface thereof with respect to the insulating film and anchored in the insulating film, and the anchor portion is engaged with the insulating film.

The anchor portion may be integrally formed with each of the leads by plate growth from the mating surface of each of the leads.

It is preferred that a through hole is formed in the insulating film such that the through hole reaches the mating surface of each of the leads, and a metal paste or a resin paste is filled in the through hole to form the anchor portion.

It is also preferred that the anchor portion is disposed proximate to a pressure contact end of each of the leads.

It is also preferred that the anchor portion is disposed on a distal end portion of each of the leads, the anchor portion is exposed to the other side relative to the side where each of the leads is intimately attached, and the pressure contact end with respect to the electronic part is formed by the exposed portion.

BRIEF DESCRIPTION OF THE DRAWINGS

The invention will now be further described by way of example only, with reference to the accompanying drawings, in which:

FIG. 9A is an enlarged cross sectional view of the main portion showing an insulating film intimately contacted with a conductive foil, FIG. 9B is an enlarged cross sectional view of the main portion showing a state in which through holes and leads are formed after the process of FIG. 9A, FIG. 9C is an enlarged cross sectional view of the main portion showing a state in which an anchor portion is formed after the process of FIG. 9B, and FIG. 9D is an enlarged cross sectional view showing a contact probe formed in the final process.

DETAILED DESCRIPTION OF THE EMBODIMENTS

Embodiments of the present invention will now be described with reference to FIGS. 3A to 9D of the accompanying drawings.

Figure 1:
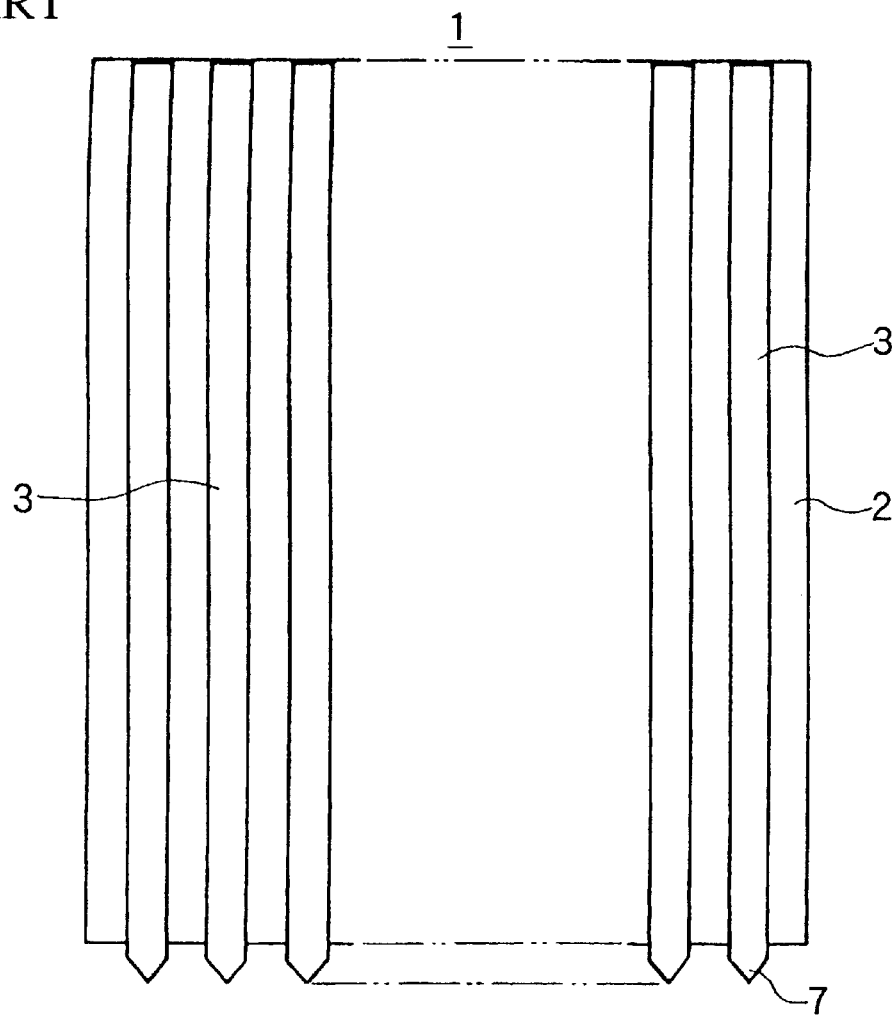
FIG. 1 is a plan view of a conventional contact probe.
Figure 2:
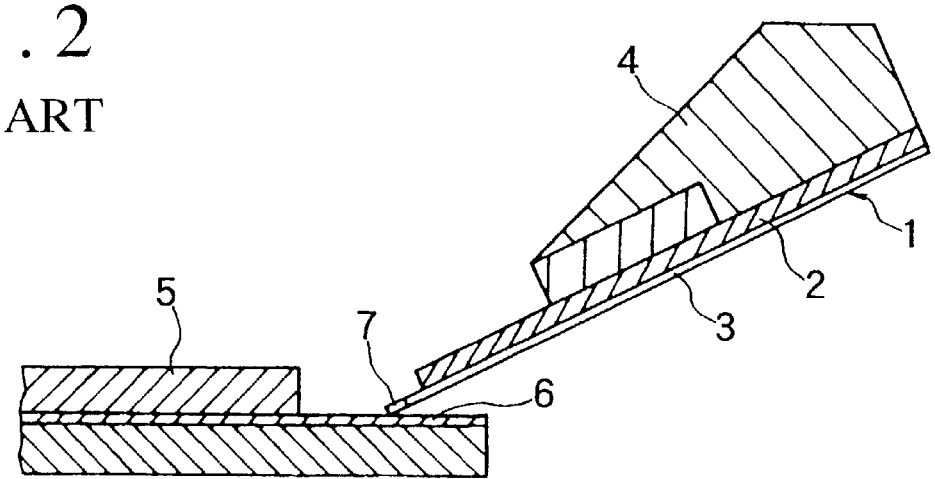
FIG. 2 is a vertical sectional view of a contactor using the above contact probe.
Figure 3A:
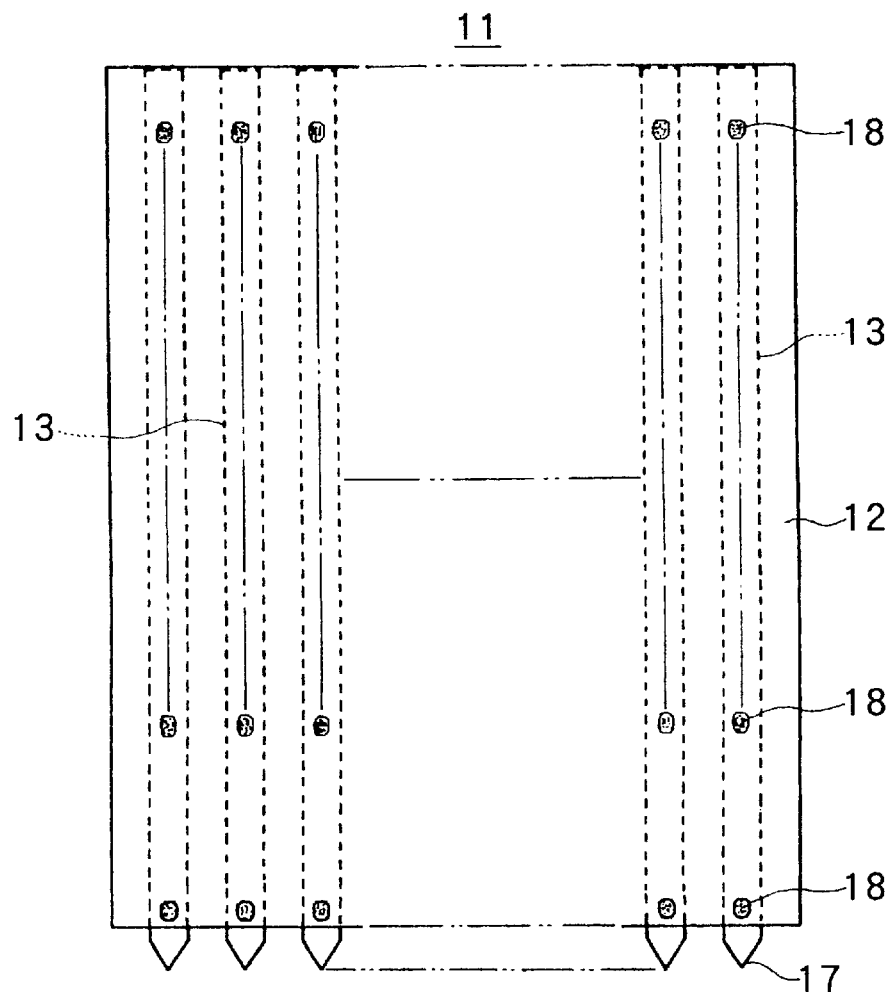
FIG. 3A is a plan view of a contact probe according to one embodiment of the present invention.
Figure 3B:
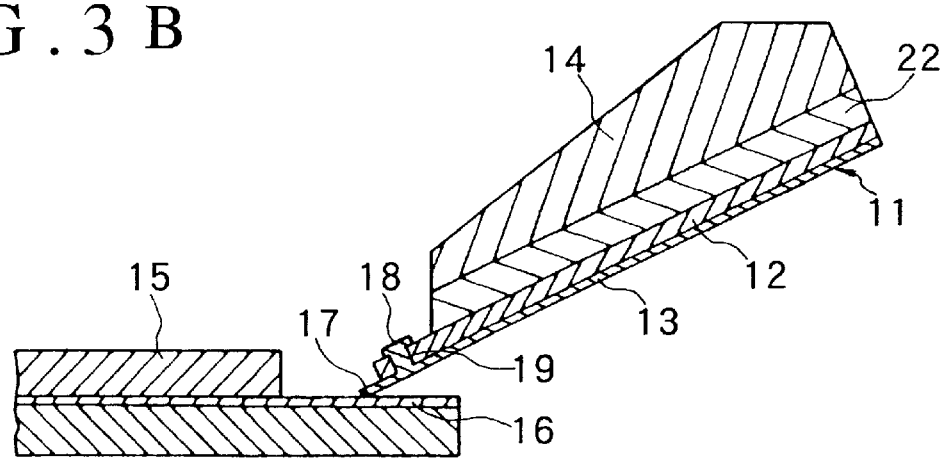
FIG. 3B is a vertical sectional view of a contactor using this contact probe.
Figure 4:
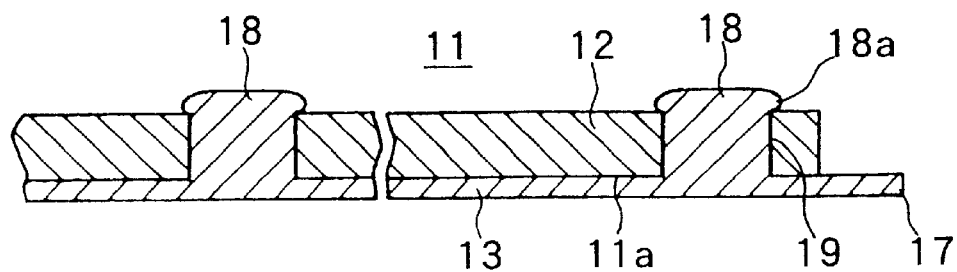
FIG. 4 is an enlarged vertical sectional view of a main portion of the contact probe of FIG. 3.
Figure 5:
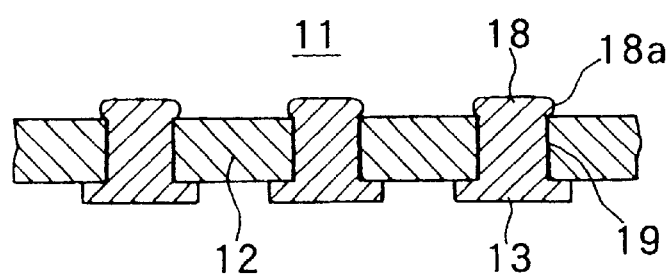
FIG. 5 is an enlarged cross sectional view of a main portion of the contact probe of FIG. 3.

As shown in FIGS. 3A and 3B, a plurality of leads 13 constituting a contact probe 11 are arranged at small pitches on a surface of an insulating film 12 and intimately contacted and integral with the film 12.

More specifically, the leads 13 are formed by plate growth of or etching a conductive metal such as, for example, Ni alloy, Cu alloy or the like, or by blanking a thin plate made of such a conductive metal. The leads 13 are arranged, side by side, on and in intimate contact relation with the insulating film 12 and extend from one end edge to the other end edge of the film.

One end of each lead 13 forms a pointed pressure contact end 17 of a given electronic part as represented by an electrode pad of a liquid crystal display unit and the other end forms a connecting end consisting of soldering or the like and subjected to connection with a tester, for example.

The pressure contact ends 17 are allowed to project beyond one end edge of the insulating film 12. For orderly arrangement, the contact ends 17 are constrained with one end edge of the insulating film 12. Owing to flexibility of the insulating film 12, vertical flexure can be obtained when the contact ends 17 are contacted under pressure with the electrode pad.

In the alternative, as shown in FIGS. 7A–8C, the pressure contact ends 17 of the leads 13 are not allowed to project beyond one end edge of the insulating film 12 but are constrained for orderly arrangement with one end edge of the film 12 while backing up the pressure contact ends 17 with one end edge portion of the film 12. In addition, a split or slit 21 is formed between the pressure contact ends 17. The slit 21 is open at one end portion of the insulating film 12.

Those slits 21 are adapted to ensure a sufficient degree of freedom of flexure of the contact end 17 of each lead 13 by the insulating film pieces 12a which are isolated by the slits 21, so that the contact ends 17 are all uniformly contacted under pressure, with the individual electrode pads each having an allowance of error in thickness.

The slits 21 are linearly formed by cutting the insulating film 12 using a laser beam, for example.

The insulating film pieces 12a have a larger width than the contact ends 17 (leads), so that the contact ends 17 will not be short circuited with each other. The contact ends 17 are prevented from forming a short circuit therebetween by an expanded portion 12b of each film piece 12a expanded from lateral end edges of each contact end 17.

It is also an interesting alternative, though not shown, that the contact ends 17 of the leads 13 are allowed to project from one end edge of the insulating film 12 and the slits 21 opening between the contact ends 17 are formed in one end edge portion of the insulating film 12.

By virtue of the provision of the slits 21, the pressure contact ends 17 are constrained by the end edge of the insulating film 12 and orderly arranged (prevented from being arranged at irregular pitches). The pressure contact ends 17 are capable of being flexed in the vertical direction (width direction of the lead) independently while being backed up by the serrated insulating film pieces 12a disposed between the slits 21.

As mentioned above, a plurality of leads 13 are arranged, side by side, on the surface of the insulating film 12 in intimate contact relation. Each lead 13 is provided with an anchor portion 18 jerked (snapped) into the insulating film 12 from an intimate-contact surface 11a with respect to the insulating film 12.

A through hole 19 is formed in the insulating film 12. This through hole 19 reaches the intimate-contact surface 11a with respect to the lead 13. Through this through hole 19, the anchor portion 18 integrally extends from the lead 13 and engages with the insulating film 12.

More specifically, as shown in FIGS. 4, 5 or 7B–7C, the through holes 19 are formed in the insulating film 12. Those through holes 19 are open at the intimate contact surface 11a with respect to the leads 13 and the film surface opposing the intimate contact surface 11a. Within each through hole 19, the anchor portion 18 integral with the lead 13 is formed from a conductive metal such as, for example, Ni alloy, by plate growth. The anchor portion 18 is exposed from the surface of the insulating film 12 to form an annular locking portion (flange portion) 18a engageable with an edge portion of the through hole 19. By this, the anchor portion 18 is engaged with the insulating film 12 to reinforce the connection of the lead 13 with the film 12.

Figure 6:
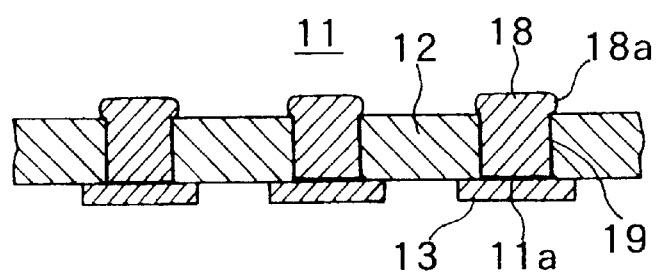
FIG. 6 is an enlarged cross sectional view showing another example of an anchor portion.

FIG. 6 shows another example of the anchor portion 18. As shown in FIG. 6, the through holes 19 reaching the intimate-contact surface 11a with the leads 13 are formed in the insulating film 12. Within each through hole 19, a metal paste or a resin paste is filled to form the anchor portion 18. This anchor portion 18 is, as in the preceding example, engaged at its annular locking portion 18a with an edge portion of the through hole 19 on the surface of the insulating film 12.

In any example mentioned above, the anchor portion 18 is firmly connected to the lead 13 at the lead intimate-contact surface 11a and jerked into the insulating film 12 through the through hole 19 to firmly connect with an inner wall of the through-hole 19. It is preferred that the through-hole 19 is formed into a wedge-like shape or irregularities are formed on the inner wall of the through hole 19. By doing so, the connecting force can be increased.

Figure 7A:
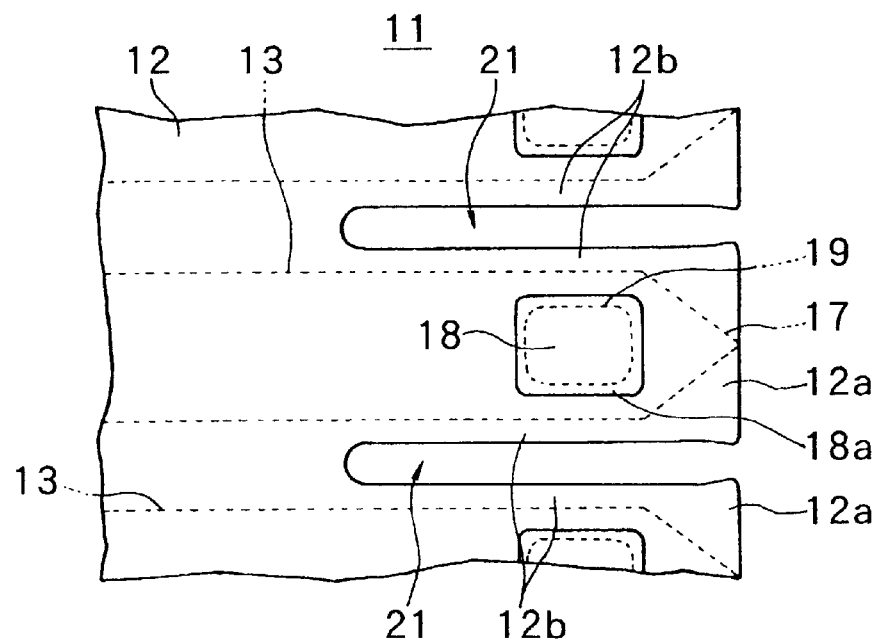
FIG. 7A is an enlarged plan view of a main portion of a pressure contact end showing another embodiment of the above contact probe.
Figure 7B:
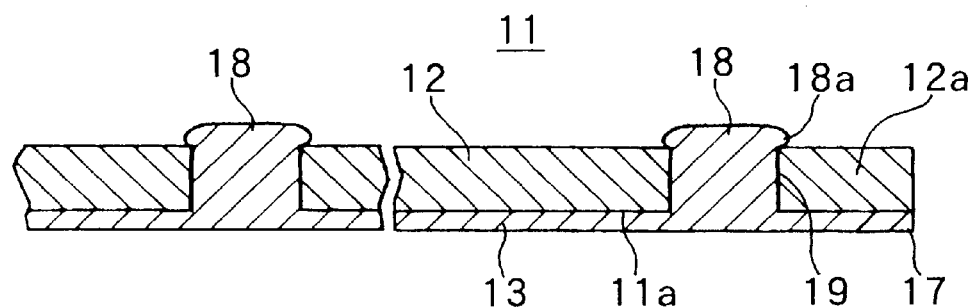
FIG. 7B is an enlarged vertical sectional view of the main portion.
Figure 7C:
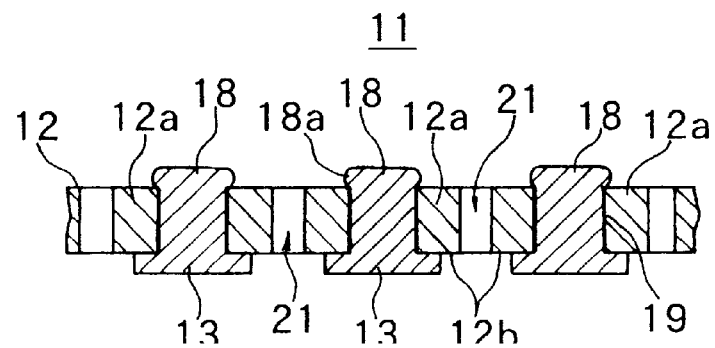
FIG. 7C is an enlarged cross sectional view of the main portion.

The anchor portion 18 is provided proximate to the pressure contact end 1 of each lead 13 (and between respective slits 21, as shown in FIG. 7A) in the manner as mentioned above, so that the connection with the insulating film 12 is reinforced in the vicinity of the contact end 17, thereby reinforcing the elastic force of the film 12. Such anchor portions 18 are spacedly provided over the length of the lead 13. Owing to this arrangement, the leads 13 can be connected uniformly to the insulating film 12 over an entire length thereof.

The anchor portion 18 may be formed only up to an intermediate portion of the thickness of the film 12 instead of being formed all the way through the thickness of the film 12.

Figure 8A:
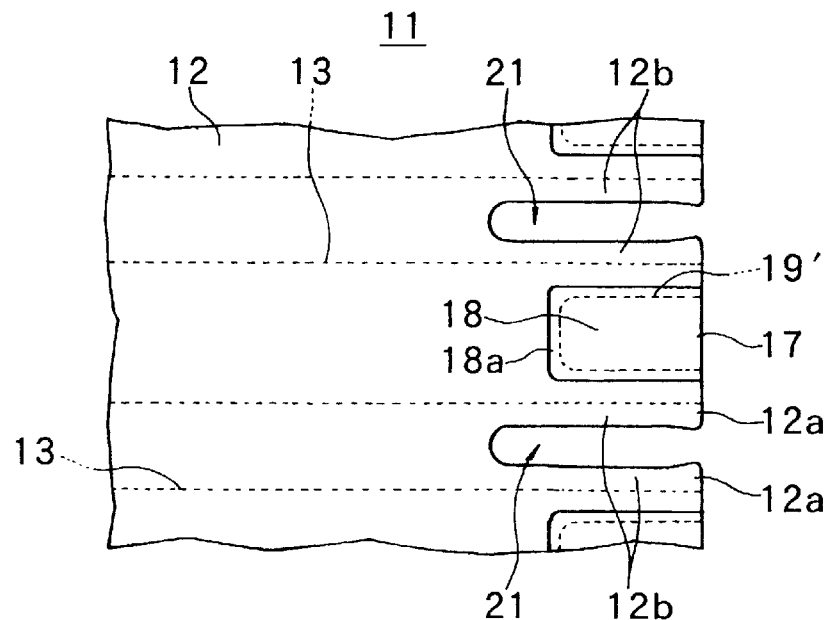
FIG. 8A is an enlarged plan view of a main portion of a contact probe showing still another embodiment of the present invention.
Figure 8B:
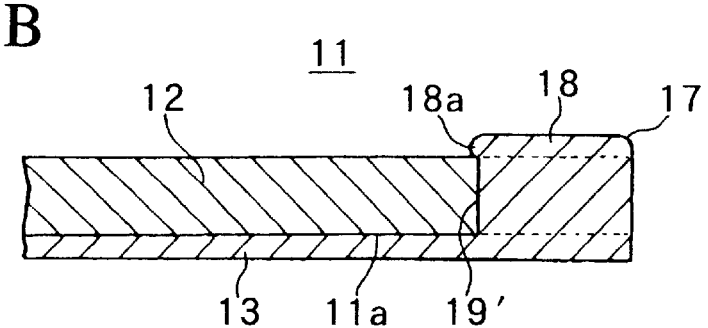
FIG. 8B is an enlarged vertical sectional view of the main portion.
Figure 8C:
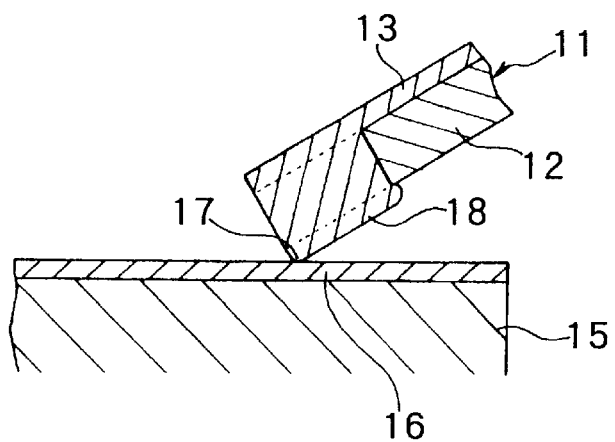
FIG. 8C is an enlarged vertical sectional view of the main portion showing a pressure contact state.

FIGS. 8A–C show another example, in which the anchor portion 18 is provided on a distal end portion of each lead 13 such that the anchor portion 18 is exposed to the other side relative to the side intimately contacted with the lead 13. This exposed portion forms the pressure contact end 17 with respect to the electronic part.

More specifically, as shown in FIGS. 8A and 8B, at the distal end portion of the lead 13, a through hole 19' is formed in the insulating film 12 from the intimate-contact surface 11a with respect to the film. Through this through hole 19', the anchor portion 18 integral with the lead 13 is formed from a conductive metal such as Ni alloy by plate growth or by filling a metal paste.

The anchor portion 18 is exposed from the surface of the insulating film 12 to the other side relative to the side intimately contacted with the lead 13, thereby forming the pressure contact end 17 with respect to the electrode pad 16 of the electronic part. In this case, it is preferred that the through hole 19' is open at a peripheral edge of the insulating film 12 and the anchor portion 18 is exposed at the peripheral edge of the film 12, so that the contact end 17 is formed by an angular portion of the anchor portion 18.

The anchor portion 18 is engaged at its annular locking portion 18a with the edge portion of the through hole 19' on the surface of the insulating film 12. By doing so, the lead 13 co-acts with the anchor portion 18 to reinforce the connection with the insulating film 12 on the side of the pressure contact end 17. Moreover, the elastic force of the pressure contact end 17 is enhanced. Accordingly, the anchor portion 18 undertakes its role as a pressure contact end, as well as its role as an anchor.

The through holes 19, 19' are formed in the insulating film 12 by laser beam, for example.

In the illustrated examples, the anchor portion 18 is formed in a generally square configuration in plan view but it may be formed in a generally circular configuration or any other suitable configuration in accordance with necessity.

A method of manufacturing the contact probe 11 will now be described with reference to FIGS. 9A–D.

Figure 9A:
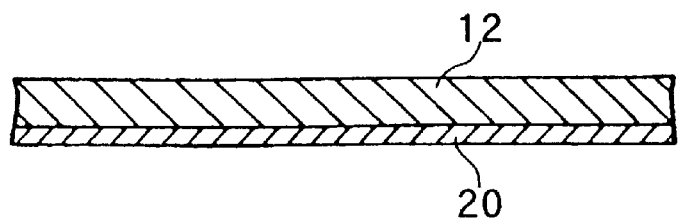
FIGS. 9A–D are enlarged cross sectional views schematically showing a process of manufacturing the contact probe.

As shown in FIG. 9A, a conductive foil 20 made of Ni alloy, Cu alloy or the like and forming a basic layer of the lead 12 is intimately adhered to the square insulating film 12 made of polyimide or the like.

The insulating film 12 may be of a single layer structure or a multiple layer structure in which the reinforcing film is overlain on an entire surface or a part of the surface on the side of the contact end.

Figure 9B:
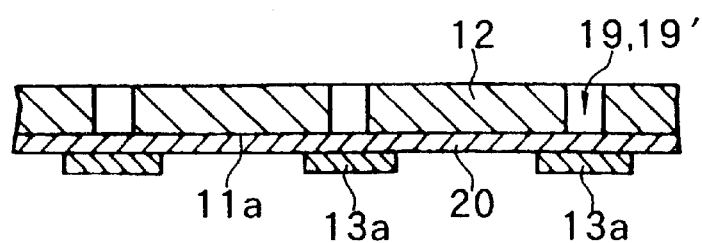

Then, as shown in FIG. 9B, a conductive metal such as Ni alloy or the like is plate grown to form a lead surface layer 13a on the conductive foil 20 and the through holes 19, 19' reaching the intimate-contact surface 11a with respect to the conductive foil 20 are formed in the insulating film 12.

Figure 9C:
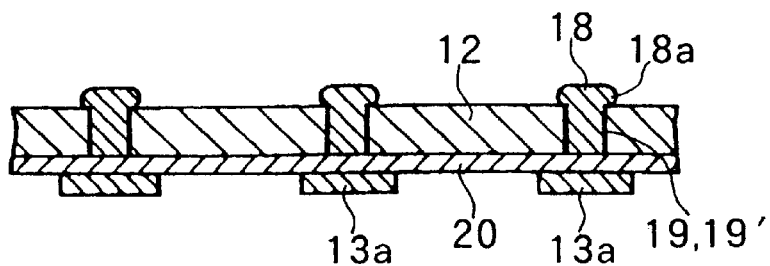

Then, as shown in FIG. 9C, a conductive metal such as Ni alloy or the like is plate grown to form the anchor portion 18 in the through holes 19, 19'. The anchor portion 18 may be formed by filling a metal paste or a resin paste in the through holes 19, 19'.

The anchor portion 18 is exposed from the through holes 19, 19' and engaged at the annular locking portion 18a with the opening edge portions of the through holes 19, 19' on the surface of the insulating film 12.

Figure 9D:
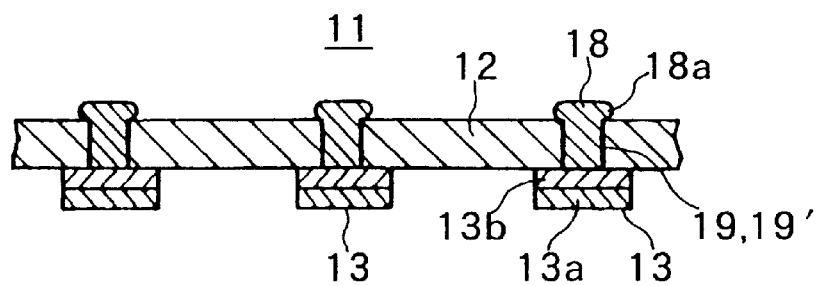

Subsequently, as shown in FIG. 9D, the conductive foil 20 portion excluding the surface layer 13a portion of the lead 13 is removed from the insulating film 12 by etching, thereby forming the basic layer 13 of the lead 13. This lead 13 consists of the basic layer 13b and the surface layer 13a. A required thickness of the overall lead is ensured by the abovementioned plate growth or etching.

The lead 13 may be formed by plate growing a single metal by etching.

In the alternative of the above manufacturing method, it is accepted that the lead surface layer 13a is formed on the conductive foil 20 by plate growth as shown in FIG. 9A, then, the conductive foil 20 is subjected to etching to form the lead 13 as shown in FIG. 9D and thereafter, the through holes 19, 19' are formed as shown in FIG. 9B and the anchor portion is formed as shown in FIG. 9D.

In this way, the contact probe 11 is obtained in which a plurality of leads 13 are arranged, side by side, at small pitches from one end edge to the other end edge of the insulating film 12 and the leads 13 are firmly adhered to the insulating film 12 by the anchor portion 18.

In the contact probe 11 described above, as shown in FIG. 3B, the insulating film 12 is adhered to a rigid block 14 either through or not through an elastic member 22 and the pressure contact end 17 of the lead 13 or the end edge portion of the film 12 formed with the slits 21 are projected forwardly of the end edge of the block 14 together with the contact end 17.

In the contact probe 11 of FIGS. 8A–C, the surface of the film 12 provided with the leads 13 is adhered to the rigid block 14 either through or not through the elastic member 22, and the contact end 17 of each lead 13, and the end edge portion of the film 12 formed with the slits 21 are projected forwardly of the end edge of the block 14 together with the contact end 17.

Over the entire length of the lead 13 of the contact probe 11 or at least in the vicinity of the pressure contact end 17, the elastic force and the intimate contacting strength by the anchor portion 18 are reinforced and the pressure contact end 17 is contacted, under pressure, with the electrode pad 16 of the electronic part such as the liquid crystal display unit 15 in a reliable manner while flexing the insulating film 12.

As apparent from the above description, according to the present invention, an intimate contacting strength between the lead and the insulating film is enhanced by the anchor portion provided on each lead forming the contact probe. Especially, by providing the anchor portion in the vicinity of the pressure contact end of each lead, the lead can effectively be prevented from being peeled off the insulating film caused by repeated flexure of the lead when pressure contacted with the electronic part.

In addition, by providing the anchor portion proximate to the pressure contact end of each lead in particular, the pressure contact end is increased in rigidity to thereby enhance the pressure contacting force of each lead. Thus, each lead can be contacted, under pressure, with the electrode pad of the liquid crystal display unit in a reliable manner.

Moreover, by exposing the anchor portion arranged on the distal end portion of each lead to the other side relative to the side intimately contacted with the lead to thereby form the contact end with respect to the electronic part, the anchor portion can function as a means for supplementing the elastic force and the intimately contacting force, while exhibiting its additional role for protecting the lead by adhering the lead to the rigid block such that the lead is concealed from outside.

Obviously, numerous modifications and variations of the present invention are possible in light of the above teachings. It is therefore to be understood that within the scope of the appended claims, the invention may be practiced otherwise than as specifically described herein.

What is claimed is:

1. A contact probe comprising:
   an insulating film having first and second opposing surfaces and through holes formed therein;
   a plurality of leads arranged on said first surface of said insulating film so that a mating surface of each of said leads is intimately contacted with said first surface of said insulating film;
   wherein a distal end portion of each of said plurality of leads is arranged for contact under pressure with an electronic part at an end edge of said insulating film;
   wherein each of said leads is provided with at least one anchor portion projecting from said mating surface and through a respective one of said holes of said insulating film;
   wherein said anchor portions of said leads respectively have flange portions engaged on said second surface of said insulating film to hold said insulating film between said leads and said flanges;
   wherein elongated slits are formed in said insulating film so as to be respectively interposed between pairs of said distal end portions of said leads at said end edge of said insulating film; and wherein said elongated slits are formed so as to open through said end edge of said insulating film; and wherein said anchor portions are disposed between said elongated slits adjacent said end edge of said insulating film, so as to reinforce a connection of said leads with said insulating film at said end edge of said insulating film.

2. A contact probe according to claim 1, wherein said anchor portion is integrally formed with each of said leads by plate growth from said mating surface of each of said leads.

3. A contact probe according to claim 1, wherein a metal paste or a resin paste is filled in said through holes to form said anchor portions.

4. A contact probe according to claim 1 wherein each of said anchor portions is disposed proximate to a pressure contact end of each of said leads.

5. A contact probe according to claim 1, wherein said flange portions of said anchor portions are formed about said anchor portions so as to constitute annular locking portions which are engaged with said second surface of said insulating film about edge portions of said through holes, respectively.

6. A contact probe according to claim 1, wherein said distal end portion of each of said leads comprises a pointed end portion.

7. A contact probe according to claim 6, wherein said flange portions of said anchor portions are formed about said anchor portions so as to constitute peripheral locking portions projecting outwardly from peripheries of said anchor portions, respectively.

8. A contact probe according to claim 7, wherein said anchor portion is integrally formed with each of said leads by plate growth from said mating surface of each of said leads.

9. A contact probe according to claim 1, wherein said flange portions of said anchor portions are formed about said anchor portions so as to constitute peripheral locking portions projecting outwardly from peripheries of said anchor portions, respectively.

* * * * *